US007425864B2

(12) United States Patent
Risbo

(10) Patent No.: US 7,425,864 B2
(45) Date of Patent: Sep. 16, 2008

(54) RECOVERY FROM CLIPPING EVENTS IN A CLASS D AMPLIFIER

(75) Inventor: Lars Risbo, Copenhagen (DK)

(73) Assignee: Texas Instruments Incorporated, Dallas, TX (US)

( * ) Notice: Subject to any disclaimer, the term of this patent is extended or adjusted under 35 U.S.C. 154(b) by 133 days.

(21) Appl. No.: 11/556,634

(22) Filed: Nov. 3, 2006

(65) Prior Publication Data

US 2007/0058711 A1 Mar. 15, 2007

Related U.S. Application Data

(62) Division of application No. 10/962,767, filed on Oct. 12, 2004, now Pat. No. 7,142,050.

(60) Provisional application No. 60/511,743, filed on Oct. 15, 2003.

(51) Int. Cl.
*H03F 3/38* (2006.01)

(52) U.S. Cl. ............. 330/10; 330/251; 330/207 A

(58) Field of Classification Search ........... 330/10, 330/251, 207 A
See application file for complete search history.

(56) References Cited

U.S. PATENT DOCUMENTS 4,724,396 A * 2/1988 Taylor et al. ............ 330/10
5,157,727 A * 10/1992 Schloss ................ 704/213
5,216,376 A * 6/1993 Swanson ................ 330/10
5,594,386 A * 1/1997 Dhuyvetter ............ 330/251
7,088,177 B2 * 8/2006 Lind ................... 330/207 A
7,315,202 B2 * 1/2008 Tsuji ..................... 330/10

* cited by examiner

*Primary Examiner*—Patricia Nguyen
(74) *Attorney, Agent, or Firm*—Wade J. Brady, III; Frederick J. Telecky, Jr.

(57) ABSTRACT

A class AD audio amplifier system (10) with improved recovery from clipping events is disclosed. The amplifier system (10) includes multiple audio channels (20), each of which can be constructed to include a pulse-width-modulator (PWM) (24). The PWM modulator (24) includes a pair of comparators (39A, 39B; 52+, 52−) that generate complementary PWM output signals based upon the comparison between a filtered difference signal and a reference waveform. Clip detection logic (26) is provided to detect clipping at the output of the channel (20), preferably by detecting successive edges of the reference waveform without an intervening edge of a PWM output signal. In response to detecting clipping, a first integrator (30; 45) is reset to remove residuals and to eliminate the first integrator (30; 45) from the loop filter of the modulator (24). A saturation level circuit (35) applies a clamping voltage, preferably in both clipping and non-clipping situations, to a second integrator (36; 47). As a result, the loop filter is prevented from entering extreme conditions during clipping, which greatly reduces the clipping recovery time.

7 Claims, 3 Drawing Sheets

RECOVERY FROM CLIPPING EVENTS IN A CLASS D AMPLIFIER

CROSS-REFERENCE TO RELATED APPLICATIONS

This application is a division of U.S. patent application Ser. No. 10/962,767, filed Oct. 12, 2004 which claims priority under 35 U.S.C. §119(e), of Provisional Application No. 60/511,743, filed Oct. 15, 2003.

STATEMENT REGARDING FEDERALLY SPONSORED RESEARCH OR DEVELOPMENT

Not applicable.

BACKGROUND OF THE INVENTION

This invention is in the field of audio amplifiers, and is more specifically directed to pulse-width modulated class D audio power amplifiers.

As is fundamental in the art, electronic amplifier circuits are often classified in various "classes". For example, the output drive transistors of class A amplifier circuits conduct DC current even with no audio signal, and the entire output voltage swing is of a single polarity. Class B amplifiers, on the other hand, typically include complementary output drive transistors, driving an output voltage swing including both positive and negative polarity excursions. Class B amplifiers are necessarily more efficient, because both complementary output drive transistors are never on at the same time. Class AB amplifiers maintain a small bias current through complementary output drive transistors, so that the output voltage swing is centered slightly above (or below) ground voltage. While the non-zero bias current renders class AB amplifiers theoretically less efficient than class B amplifiers, class AB amplifiers present avoid the crossover distortion of class B amplifiers.

In recent years, digital signal processing techniques have become prevalent in many electronic systems. The fidelity provided by digital techniques has increased dramatically with the switching speed of digital circuits. In audio applications, the switching rates of modern digital signal processing are sufficiently fast that digital techniques have become widely accepted for audio electronic applications.

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. As known in the art, CMOS drivers conduct extremely low DC current, and their resulting efficiency is especially beneficial in portable and automotive audio applications, as well as in small form factor systems such as flat-panel LCD or plasma televisions. In addition, the ability to realize the audio output amplifier in CMOS enables integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

FIG. 1 illustrates the architecture of a conventional class D audio amplifier, specifically a so-called "class AD" audio amplifier with a bridged load. In this conventional audio implementation, audio speaker SPKR is the load, and is bridged between pairs of output transistors 7A, 7C; 7B, 7D. Feedback from the output is also used to generate a negative feedback signal via feedback unit 9. In this architecture, input analog signal IN is received at one end of adder 11, along with this negative feedback signal. Adder 11 presents a difference signal between the input IN and the feedback signal to loop filter 13, which applies transfer function H(s) that establishes the stability of the system and also the extent to which error is suppressed by the feedback loop. The filtered difference signal from loop filter 13 is applied to an input of natural sampling pulse width modulator 1.

Conventional pulse width modulator 1 includes comparator 5, which compares its input signal from loop filer 13 with a triangle wave generated by signal source 3, and applied to the negative input of comparator 5. The triangle waveform is at a period T and a switching frequency $F_{sw}$, as shown. In this example, in which the load SPKR is bridged between output drive transistors, comparator 5 generates complementary, two-level, pulse-width-modulated (PWM) output signals. Referring to the positive output from comparator 5, which is applied to output transistors 7A and 7D, the output signal is at an amplitude of +1 (turning on transistors 7A, 7D) responsive to the filtered input difference signal being instantaneously higher than the current state of the triangle waveform, and at an amplitude of −1 (turning off transistors 7A, 7D) responsive to this input signal instantaneously being lower than the current state of the triangle waveform. The negative output of comparator 5 produces a complementary output signal, turning on and off transistors 7B, 7C. It is known to include some sort of gating or synchronization between the complementary output signals to ensure that both output drive stages are not on at the same time, thus ensuring that "crowbar" current is not drawn.

This conventional amplifier circuit is often referred to as a class "AD" amplifier arrangement, in that a zero input signal (i.e., zero difference signal between input signal IN and the feedback signal, as filtered by loop filter 13) will produce a 50% duty cycle output drive across load SPKR. This class AD arrangement is effected by transistors 7A, 7D being turned on while transistors 7B, 7C are off, so that current flows from left-to-right through load SPKR in one half-cycle, and so that transistors 7B, 7C are on while transistors 7A, 7D are off in the other half-cycle, during which current flows from right-to-left through load SPKR. In this arrangement, the common mode voltage across the bridged load SPKR is zero volts.

By way of further background, other class D amplifier arrangements are also known in the art. One such arrangement is referred to as the class "BD" amplifier, by way of analogy to class B analog amplifiers. In the class BD amplifier, the bridged load is driven by separate modulators. As a result, there are three possible drive states across the bridged load: full positive polarity, full negative polarity, and zero volts. As a result, for zero input signal, no output PWM signals appear at all (i.e., there is zero output, or the PWM output is at a "zero" state).

Class D amplifiers have become attractive for audio applications, especially as the desired output power levels have increased over recent years. The efficiency of class D amplifiers in driving loudspeakers can be higher than 90%, which is much higher than the efficiency provided by conventional analog audio amplifiers. Among other benefits of this improved efficiency, the heat that is dissipated in the drive circuitry is much reduced, and thus the amplifier heat sinks can be much smaller (and thereby lighter). Class D audio amplifiers have thus become quite popular for portable and automotive audio systems.

As mentioned above, conventional class D amplifiers include a loop filter for stabilizing the system and also suppressing error in the feedback loop. By way of further background, copending application Ser. No. 10/846,281, filed May 14, 2004, entitled "Improved Loop Filter for Class D Amplifiers", commonly assigned with this application and incorporated herein by reference, describes a class D amplifier circuit in which the open-loop error for audio band frequencies is improved by a loop filter that has multiple feedback loop paths.

As well known in the art, the undesirable effect of amplifier "clipping" refers to the distortion at the amplifier output that occurs when the input signal to the amplifier exceeds the capability of the amplifier to drive its output. Typically, clipping appears as a squaring-off of the top of sinusoidal waveforms, with the clipped level corresponding to the maximum amplitude deliverable at the amplifier output. In the audio context, of course, the clipping of sinusoidal waves injects significant wideband energy into the output frequency spectrum which, to the extent that the energy extends into the audible frequency band, is audible as noise, typically as a crunching sound.

Of course, the noise resulting from clipping is extremely undesirable, especially in audio systems. But additionally, the loop filter in a conventional class D amplifier will be driven to an extreme state during clipping, as the filter is attempting to compensate for the difference between the clipped output and the overdriving input. And when the clipping event ends, this extreme state of the loop filter will tend to remain for some time, until the output levels have been in an unclipped condition for sufficient time for the loop filter to have settled back to normal operation. Conventional class D amplifiers therefore present distorted output not only when clipping, but also for a noticeable duration after the input is no longer overdriven into clipping.

BRIEF SUMMARY OF THE INVENTION

It is therefore an object of this invention to provide a class D amplifier in which the recovery time from a clipping event is substantially reduced.

It is a further object of this invention to provide such an amplifier in which the clipping recovery by way of circuitry that does not affect normal operation of the amplifier.

It is a further object of this invention to provide such an amplifier in which the clipping recovery remains stable over variations in power supply voltage.

Other objects and advantages of this invention will be apparent to those of ordinary skill in the art having reference to the following specification together with its drawings.

The present invention may be implemented into a class D amplifier, such as an audio amplifier, in which edges of the pulse-width-modulator output pulses and the reference waveform are monitored. Clipping is detected upon receipt of a plurality of reference waveform edges occurring without an intervening pulse-width-modulator output pulse edge. Upon the detecting of a clipping event, integrators in the loop filter are reset by discharging residual charge, and with the highest order integrator clamped to a level corresponding to a near-clipping state. Preferably, the clamping level follows variations in the power supply voltage. Rapid recovery from the clipping event is attained.

DETAILED DESCRIPTION OF THE INVENTION

The present invention will be described in connection with its preferred embodiment, namely as implemented into an audio system, such as an automobile sound system, as it is contemplated that this invention is especially beneficial in such an application. However, it is also contemplated that this invention will be beneficial in many other applications in which class D amplifiers, or pulse-width-modulators, are applicable. Accordingly, it is to be understood that the following description is provided by way of example only, and is not intended to limit the true scope of this invention as claimed.

Figure 2:
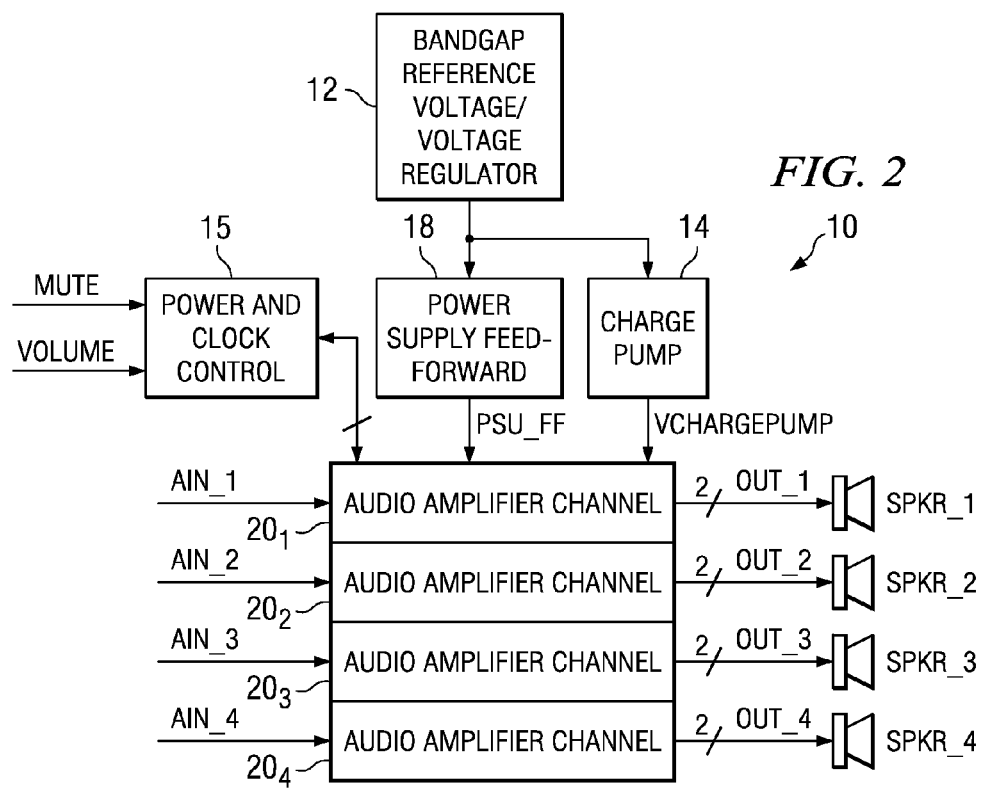
FIG. 2 is an electrical diagram, in block form, of a digital audio amplifier system constructed according to the preferred embodiment of the invention.

FIG. 2 illustrates the construction of digital audio amplifier system 10 constructed according to the preferred embodiment of the invention. In this example, system 10 is capable of driving four output audio channels from four separate analog inputs. It is, of course, contemplated that system 10 may drive more or fewer channels, depending upon the system requirements and specifications. In this example, therefore, four analog input signals AIN_1 through AIN_4 are received at the inputs of audio amplifier channels $20_1$ through $20_4$, respectively. Audio amplifier channels $20_1$ through $20_4$ in turn drive class D output signals OUT_1 through OUT_4, respectively, which drive respective ones of speakers SPKR_1 through SPKR_4. In this embodiment of the invention, speakers SPKR_1 through SPKR_4_ are bridged loads to audio amplifier channels $20_1$ through $20_4$, and as such output signals OUT_1 through OUT_4 include two signals, one from each of two half-bridge outputs for each channel $20_1$ through $20_4$. The combination of the half-bridges applying the output to speakers SPKR_1 through SPKR_4 is often referred to as an "H-bridge", as known in the art. In this specific example, as will become apparent from the following description, audio amplifier channels $20_1$ through $20_4$ are constructed to have class AD output drive characteristics, in which case the output signals OUT_1 through OUT_4 each include complementary output signals from the two half-bridge outputs.

Various control circuitry is also included within system 10 according to this embodiment of the invention. Power and clock control circuitry 15 provides the conventional control functions for digital audio system 10, such functions, including overvoltage and undervoltage detection and protection, detection and control related to other faults in the operation of system 10, clock circuitry for generating the various clock signals used by system 10 and, according to this invention, receipt and processing of mute signal MUTE. Voltage regulator circuit 12, which may include a bandgap or other reference voltage generator circuit, a conventional voltage regulator circuit, or both, provides regulated power supply and regulated reference voltages to the various other functions in system 10, and also to audio amplifier channels 20, in the conventional manner. Charge pump 14 is a conventional charge pump circuit that provides the appropriate voltages to gate drive circuits in the half-bridge outputs of audio amplifier channels 20.

Power supply feed-forward circuit 18 is also preferably provided in system 10. As known in the class D amplifier art, the gain of an H-bridge is proportional to the power supply voltage, while the gate of a pulse-width-modulator is inversely proportional to the amplitude of the reference waveform (e.g., a triangle or sawtooth reference waveform). As a result, the loop gain (i.e., the product of the H-bridge and PWM gains) can undesirably vary with variations in the power supply voltage, causing potential loop stability problems and the introduction of undesired signal modulation. To compensate for this effect, as known in the art, power supply feed-forward circuit 18 forwards the same power supply voltage used to set the amplitude of the reference waveform as the power supply voltage that biases the half-bridge output circuits of audio amplifier channels 20. In this way, any variations in this power supply voltage will appear both at the reference waveform amplitude and also at the output, in which case the loop gain will effectively remain constant over these variations.

Figure 3:
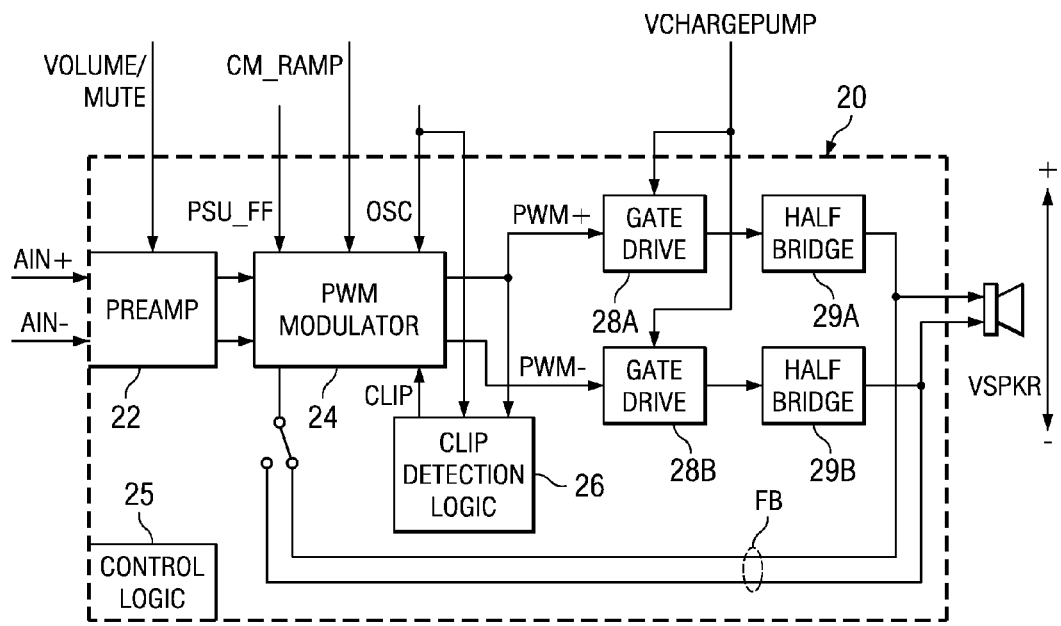
FIG. 3 is an electrical diagram, in block form, of the audio amplifier for an output channel in the digital audio amplifier system of FIG. 2, constructed according to the preferred embodiment of the invention.

Referring now to FIG. 3, the construction of one of audio amplifier channels 20 will now be described in further detail. It is of course contemplated that each of audio amplifier channels 20$_1$ through 20$_4$ in system 10 will be constructed identically as one another, corresponding to the construction of channel 20 as shown in FIG. 3. Of course, the particular construction of one or more of channels 20 may vary from that shown in FIG. 3, if appropriate for a particular application.

Differential analog input signals AIN+, AIN− are received by audio amplifier channel 20 at preamplifier 22. As will become more apparent from the following description, it is contemplated that audio amplifier channel 20 will typically be implemented in a fully differential fashion, as reflected by the differential analog input signals AIN+, AIN−. However, audio amplifier channel 20 may alternatively be implemented in single-ended fashion if desired, in which case the analog audio input signal would be a single-ended signal (or converted from a differential signal to a single-ended signal within channel 20). It is contemplated that those skilled in the art will be readily able to construct audio amplifier channels 20 in either differential or single-ended arrangements, as desired. The generalized construction of channel 20 illustrated in FIG. 3 is intended to be applicable to either implementation.

Preamplifier 22 includes a preamplifier for amplifying the analog input level for application to PWM modulator 24, to an amplification level corresponding to volume and mute control signal VOLUME/MUTE from power and clock control circuit 15 (FIG. 2), which is in response to a user input. For muting and unmuting of the audio output, of course, the volume and mute control signal effectively gates the output of preamplifier 22 to a zero output level in a muted condition, or to the desired volume output in an unmuted condition. One example of the construction of preamplifier 22 is described in copending application Ser. No. 10/836,067 filed Apr. 30, 2004, commonly assigned herewith and incorporated herein by this reference.

The output of preamplifier 22 is then applied to PWM modulator 24, along with a feedback signal on lines FB. PWM modulator 24 receives a reference waveform on line OSC, from a local oscillator in power and clock control circuit 15, according to which it effects the pulse-width-modulation used to generate the class D output signals. PWM modulator 24 also receives a power supply voltage on line PSU_FF from power supply feed-forward circuit 18.

Figure 1:
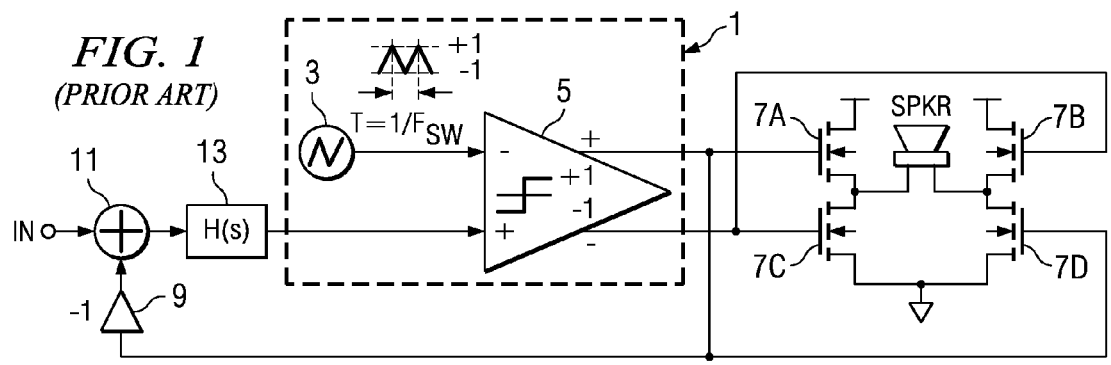
FIG. 1 is an electrical diagram, in schematic form, of a conventional class AD audio amplifier system.

PWM modulator 24 generates a pulse-width-modulated output on a pair of output lines PWM+, PWM− to gate drivers 28A, 28B, respectively. Control logic (not shown) may be provided between PWM modulator 24 and gate drivers 28A, 28B, to process the PWM output from modulator 24 to ensure adequate pulse widths, or to interlock the signals to avoid crowbar output conditions, and the like. Gate drivers 28A, 28B each generate the appropriate output levels to drive the gates of transistors in half-bridges 29A, 29B, respectively. These output levels are controlled by voltage VCHARGEPUMP from charge pump 14 (FIG. 2), in the conventional manner. Half bridges 29A, 29B each include the appropriate power output transistors for driving speaker SPKR in response to the PWM output signal. For example, half-bridge 29A may include a pull-up transistor and a pull-down transistor connected on opposite sides of speaker SPKR to drive current of one polarity when on, similarly as transistors 7A, 7D of FIG. 1. Half-bridge 29B includes opposing pull-up and pull-down transistors driving speaker SPKR with current of the opposite polarity when on, similarly as transistors 7B, 7C of FIG. 1. In this arrangement, each of half-bridges 29A, 29B receive complementary PWM signals, so that the transistors of half-bridge 29A are on when the transistors of half-bridge 29B are off, and vice versa. In this manner, speaker SPKR is driven as a bridged load, in class AD fashion. The signals driven by half-bridges 29A, 29B are also fed back to PWM modulator 24 on lines FB, for application to the modulation process as will be described below.

Also as shown in FIG. 3, channel 20 includes clip detection logic 26, which receives at least one of the PWM output signals from PWM modulator 24, in combination with the reference waveform on line OSC from a local oscillator in power and clock control circuit 15. As will be described in further detail below, clip detection logic 26 compares edges of the PWM output signal with edges of the reference waveform on line OSC in order to detect whether the output is currently in a clipping state and if so, issues a control signal on line CLIP to PWM modulator 24 to maintain the loop filter in PWM modulator 24 within reasonable bounds, so that recovery from the clipping event can occur rapidly.

As illustrated in FIG. 3, each of channels 20 includes an individual instance of clip detection logic 26. Alternatively, clip detection logic 26 may be implemented globally, so that the PWM loop filters in all of channels 24 are controlled if clipping is detected at the output of any one of channels 20.

Figure 4:
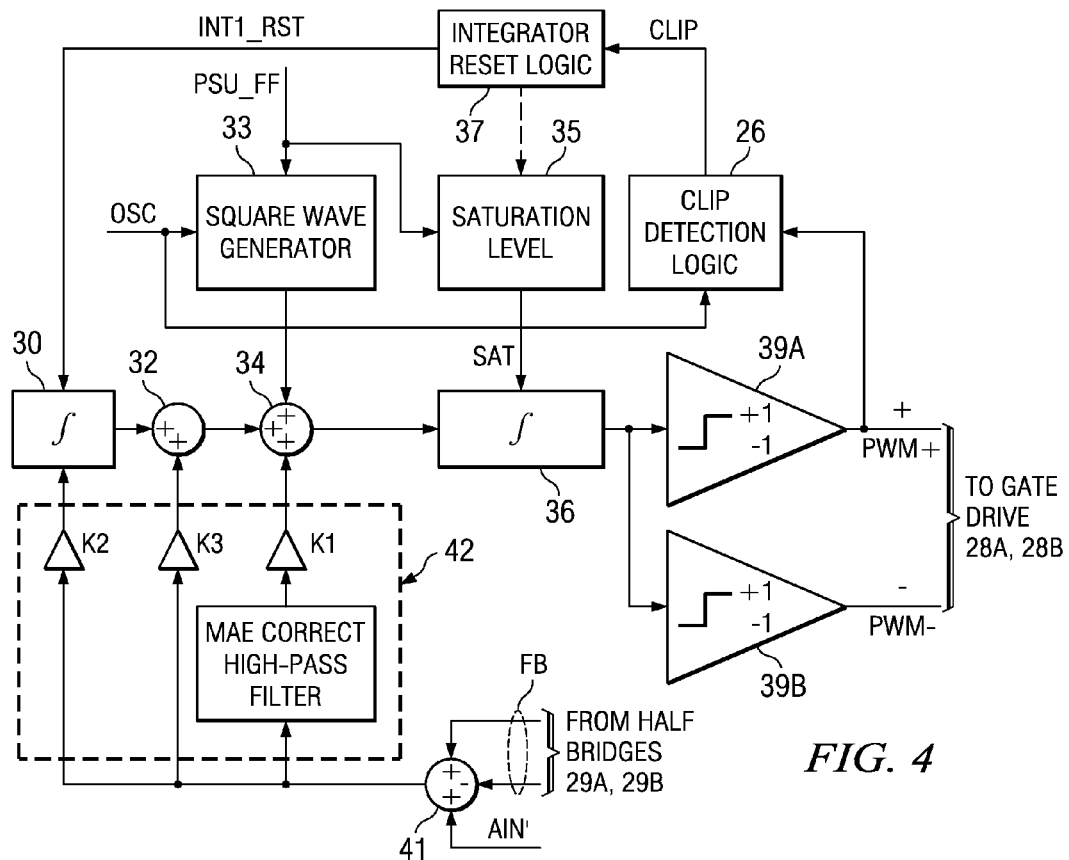
FIG. 4 is an electrical diagram, in block form, of modulator circuitry in an audio channel of the digital audio amplifier system of FIG. 2, constructed according to the preferred embodiment of the invention.

Referring now to FIG. 4, the construction of PWM modulator 24 will now be described, in its operable combination with clip detection logic 26. Analog input signal AIN', which corresponds to the output of preamplifier 22 (FIG. 3), is received at adder 41. Adder 41 also receives a feedback signal FB from half-bridges 29A, 29B, in the form of a differential voltage driven across load SPKR. The output of adder 41, corresponding to the difference between the input signal AIN' and the feedback signal FB is applied to loop filter block 40. According to this embodiment of the invention, loop filter block 40 applies filters and gains to this difference signal. As described in further detail in copending application Ser. No. 10/846,281, filed May 14, 2004, commonly assigned herewith and incorporated herein by this reference, the PWM modulator loop filter preferably includes at least one loop path with a transfer function of second order or higher, and at least one loop path in which the maximum negative slope of the magnitude versus frequency for frequencies below the switching frequency is lower than the negative slope of its real part at frequencies above the switching frequency. In the example shown in FIG. 4, the loop filter is realized as a single loop filter involving the combination of loop filter block 40 with first and second integrators 30, 36. In this case, the multiple loop paths preferably operate upon the feedback signal on lines FB from half-bridges 29A, 29B so that the loop filter suppresses distortion from half-bridges 29A, 29B; alternatively, the feedback signal may be derived from the output of PWM control logic 26, or from the output of gate drives 28. Further in the alternative, the loop filter of modulator 24 can be implemented in the conventional manner.

In any event, according to the example of FIG. 4, first integrator 30 receives a filtered difference signal corresponding to the difference between an input signal corresponding to the desired audio output and feedback from the current audio output. First integrator 30 integrates this difference and forwards the result to a sequence of adders 32, 34. Adder 32 adds in another feedback term from loop filter block 40 to the integrated difference from first integrator 30. Adder 34 receives the output of adder 32, adds in another feedback term from loop filter block 40 (preferably including a high-pass filter, as described in copending application Ser. No. 10/846, 281), and also adds the reference waveform from square wave generator 33; the sum from the output of adder 34 is then integrated by second integrator 36.

In this embodiment of the invention, the PWM reference waveform is generated by square wave generator 33 in response to a periodic signal presented on line OSC from power and clock control circuit 15 (FIG. 2), having an amplitude corresponding to a voltage communicated on line PSU_FF from power supply feed-forward circuit 18 (FIG. 2). As fundamental in the PWM art, a pulse-width-modulated signal is generally produced from the difference between a periodic sawtooth or triangle waveform and the difference signal. Because the output of adder 34 is applied to second integrator 36 in this embodiment of the invention (and considering that the integral of a square wave is a triangle wave), the reference waveform in this example is applied as a square wave. In addition, because this reference waveform is periodic, it can be either added to or subtracted from the difference signal from adder 32, assuming no DC offset in the reference waveform. And even if DC offset is present in the reference waveform, first integrator 30 will integrate out any resulting DC error, because the reference waveform is injected after first integrator 30.

As shown in FIG. 4, the output of second integrator 36 is applied to comparator 39A, which generates a pulse-width-modulated signal of one polarity, and to comparator 39B, which generates a complementary PWM signal relative to that of comparator 39A. These PWM output signals, which correspond to the output signals to be applied to half-bridges 29A, 29B, may be further processed by PWM control logic (not shown).

According to the preferred embodiment of the invention, clip detection logic 26 also has inputs connected to output lines PWM+, PWM−. Alternatively, the inputs of clip detection logic 26 may instead be coupled to the output of gate drives 28A, 28B, or even to the output of half-bridges 29A, 29B; however, it is contemplated that the construction of clip detection logic 26 is facilitated by receiving the relatively low digital levels (i.e., logic signals) at output lines PWM+, PWM− rather than the higher power output drive signals. Clip detection logic 26 also receives a signal corresponding to the periodic reference waveform generated by square wave generator 33; this signal can correspond to the output of square wave generator 33 itself, or may instead correspond to the periodic signal on line OSC used to generate the reference waveform, or another similar such signal. In any case, clip detection logic 26, according to this preferred embodiment of the invention, detects clipping events by analyzing pulse-width-modulated output pulses from modulator 24 relative to the reference waveform used to generate these pulses. The output of clip detection logic 26 drives line CLIP, which is applied to integrator reset logic 37. In this manner, integrator reset logic 37 resets first integrator 30 via lines INT1_RST, and also optionally has an output connected to saturation level circuit 35. Saturation level circuit 35 applies a saturation voltage to second integrator 36 via line SAT; preferably, this saturation voltage is proportional to the current feed-forward power supply voltage on line PSU_FF, as will be described in further detail below. The construction and operation of clip detection logic 26 will also be described in further detail below.

Also according to this preferred embodiment of the invention, clip detection logic 26 responds to detected clipping events by controlling the operation of the loop filter in PWM modulator 24. In general, clip detection logic 26 prevents this loop filter from entering an extreme state that delays recovery, following the end of the clipping event, in conventional PWM modulators. In the example of FIG. 4, clip detection logic 26 prevents these extreme loop filter conditions by resetting first integrator 30 via lines INT1_RST. Clip detection logic 26 may also control saturation level circuit 35 to apply the saturation voltage on line SAT to second integrator 36; alternatively, the saturation voltage on line SAT may be applied at all times to second integrator 36, for example as a clamping voltage beyond which the voltage at second integrator 36 may not stray.

Figure 5:
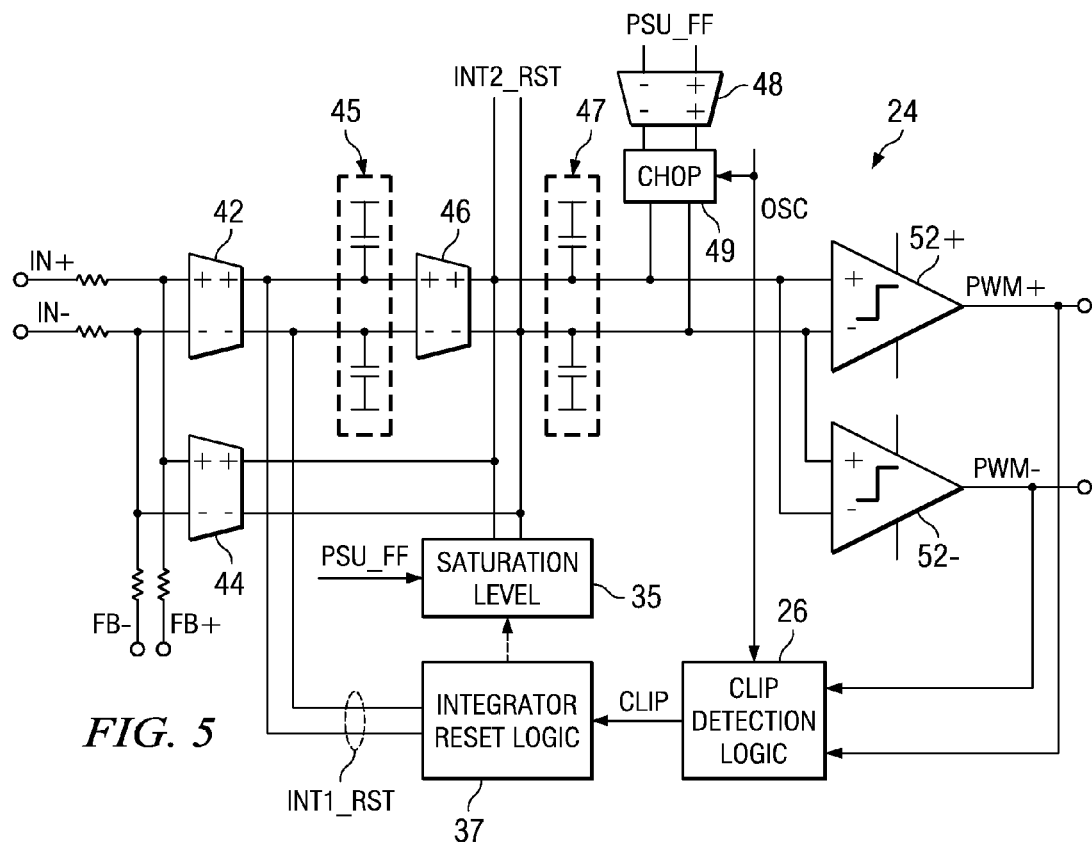
FIG. 5 is an electrical diagram, in schematic form, of a differential implementation of the modulator circuitry of FIG. 4, according to a preferred embodiment of the invention.

As apparent from this description, with reference to FIGS. 4 and 5, this embodiment of the invention involves a second order loop filter. And according to this preferred embodiment of the invention, the first integrator is reset in response to detection of a clipping condition, while the second integrator is clamped. This invention may be applied also to PWM modulators that include loop filters of higher than second order. For such higher order loop filters, it is contemplated that the last integrator (i.e., the closest integrator to the comparators) will be clamped, and that all of the other integrators preceding that last integrator will be held in a reset condition, thus forcing the loop filter to operate as a first order system, with bounded output, during clipping.

FIG. 5 illustrates the construction of PWM modulator 24, in combination with clip detection logic 26 and saturation level circuit 35, according to a fully differential implementation, which is preferred for many applications. Of course, given the functional description of PWM modulator 24 as provided above relative to FIG. 4, it is contemplated that those skilled in the art will be readily able to implement PWM modulator 24 according to other implementations, including a single-ended signal implementation. However, for ease of implementation and also stability of operation, the fully differential implementation of FIG. 5 is preferred, according to this preferred embodiment of the invention.

As shown in FIG. 5, the differential input signal is received on lines IN+, IN− from preamplifier 22, and is applied to the positive and negative inputs of differential operational transconductance amplifier (OTA) 42. OTA 42 may be constructed according to conventional techniques, and as is also known in the art, produces a differential current output in response to the differential voltage received at its input. According to this embodiment of the invention, a differential feedback signal from loop filter block 40 (FIG. 3) is received on lines FB+, FB−, and is applied to the negative and positive inputs of OTA 42, respectively. Because the polarity of the feedback signal on lines FB+, FB− is reversed from that of input signal IN+, IN− as applied to OTA 42, the differential input voltage applied to OTA 42 corresponds to the difference between the input signal and the feedback signal, and thus OTA 42 generates a differential current that corresponds to an error value (i.e., the difference between the desired output, as represented by the differential input voltage, and the current output, as represented by the differential feedback signal).

The output of OTA 42 is applied to first integrator 45. Because the difference signal at the output of OTA 42 is a differential current, first integrator 45 is implemented by way of a pair of capacitors, each connected between one of the outputs of differential OTA 42 and a reference voltage, thus producing a differential voltage (the voltage across the integrating capacitors corresponding to the integral of the charging current over time). This integrated difference current, in the form of a differential voltage, is applied to the differential input of OTA 46, which produces a differential current at its output that corresponds to the integration of the difference current from OTA 42. The output of OTA 46 is applied to second integrator 47, which is also implemented by way of parallel capacitors coupled to the differential output lines from OTA 46.

As mentioned above, the loop filter of PWM modulator 24 in this preferred embodiment of the invention, as described in detail in copending application Ser. No. 10/846,281, involves multiple feedback loop paths. As such, OTA 44 receives a differential voltage corresponding to the difference between the input voltage (IN+, IN−) and the feedback voltage (FB+, FB−), and applies a differential current to second integrator 47, along with the integrated difference current produced by OTA 46.

According to this preferred embodiment of the invention, reset signals INT1_RST, INT2_RST are applied to first and second integrators 45, 47, respectively. These reset signals effectively discharge first and second integrators 45, 47 upon power-up or some other event in which the PWM outputs are expected to be quite different from, and have no relation to, the input signal. In this way, the previous condition of PWM modulator 24 is removed, reducing the latency in PWM modulator 24 in reaching the appropriate desired output state after reset. And according to this preferred embodiment of the invention, reset signals INT1_RST are driven by integrator reset logic 37 in response to an active signal on line CLIP from clip detection logic 26, so that first integrator 45 is reset upon detection of clipping at the output, as will be described in further detail below.

The pulse-width-modulation reference signal is also applied to the summing node at second integrator 47. According to this embodiment of the invention, feed-forward power supply voltage PSU_FF is applied, as a differential voltage signal, to OTA 48, which in turn generates a differential current corresponding to the desired amplitude of the reference waveform. Chop circuit 49 chops this differential current from OTA 48 at a frequency determined by a periodic signal received on line OSC from power and clock control circuitry 15 (FIG. 2). The output of chop circuit 49, therefore, is a differential current in the form of a square wave, at the frequency defined by the signal on line OSC, and at an amplitude that corresponds to the feed-forward power supply voltage PSU_FF. This differential square wave current is applied to the summing nodes at second integrator 47, along with the sum of the output of OTA 46 and the feedback signal from OTA 44.

The summed currents are integrated by second integrator 47 to establish a differential voltage that is applied to the inputs of comparator 52+, and (in a reversed polarity) to the inputs of comparator 52−. Comparators 52+, 52− are conventional differential comparators, for comparing the level at its input against a reference level, and generating a full-scale output level on its output lines PWM+, PWM−, respectively. Considering that comparators 52+, 52− have their inputs connected to second integrator 47 in reverse polarity relative to one another, the outputs of comparators 52+, 52− will be logical complements of one another.

Figure 8:
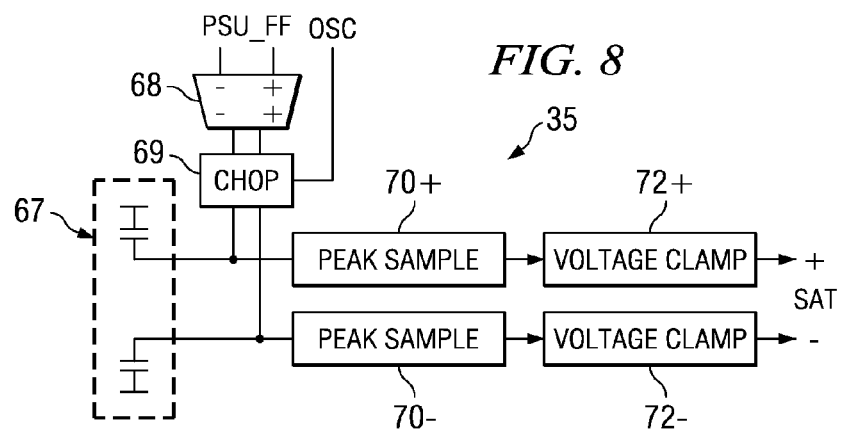
FIG. 8 is an electrical diagram, in block and schematic form, of saturation level circuitry operating in combination with the modulator circuitry of FIG. 5 according to the preferred embodiment of the invention.

Also according to this preferred embodiment of the invention, saturation level circuit 35 clamps the level of the differential voltage at second integrator 47, either at all times or in response to the detection of output clipping. Preferably, the clamping voltage effected by saturation level circuit 35 is proportional to the current power supply voltage on line PSU_FF. A preferred clamping level is approximately twice the peak voltage of the reference waveform applied to second integrator 47 by chop circuit 49; indeed, in this differential implementation of FIG. 5, this reference waveform is in fact the response of second integrator 47 to the periodic square wave input. According to the preferred embodiment of the invention, this clamping level corresponds to the peak output of second integrator 47 (or second integrator 36 of FIG. 4) when the amplifier of channel 20 is driven to a level just below the clipping condition. The clamping of second integrator 47 is bipolar, in the sense that it operates on both positive and negative polarity signals. Saturation level circuit 35 may be constructed as a conventional voltage clamp circuit, as well-known in the art; a preferred construction of saturation level circuit 35 is illustrated in FIG. 8, and will be described in further detail below.

It has been observed, according to this invention, that certain audio amplifier applications are subject to wide variations in power supply voltage. For example, automotive audio systems especially are required to operate over a wide power supply voltage range, such as from about 8 volts to about 20 volts. Considering that the amplitude of the reference waveform varies with power supply voltage variations, as mentioned above, it is therefore advantageous to also have the saturation level also follow these variations. If the saturation, or clamp, voltage is fixed at too low a level (and if the power supply voltage is at the higher end of its range), signals will be clamped at second integrator 47 that would not cause clipping, thus inserting distortion into the audio output; conversely, if the saturation voltage is fixed at too high a level (and the power supply voltage is at the lower end of its range), no clamping would be effected at second integrator 47 even if the clipping were occurring at the output of channel 20. Accordingly, saturation level circuit 35 receives the feed-forward power supply voltage on line PSU_FF, and adjusts its clamping level accordingly, in the conventional manner for voltage clamp circuits, as well known in the art.

In steady-state normal operation, a differential analog input voltage from preamplifier 22 is received at OTAs 42, 44, along with a differential feedback voltage from loop filter 40. The difference current at the output of OTA 42 is integrated by first integrator 45, and applied to OTA 46, which generates a differential current corresponding to the integration of the difference current from OTA 42. This integrated difference current is summed with second-order feedback from OTA 44, and with the reference waveform, in the form of a square wave of differential current from chop circuit 48 at the frequency of the signal on line OSC. Those skilled in the art will recognize that, for purposes of pulse-width-modulation, the addition of a differential periodic waveform to a differential signal that is time-varying at a much lower frequency than the periodic waveform, with both signals at the same DC level (e.g., ground) results in a summed signal that is equivalent to the difference signal that would result if the signals were subtracted from one another. In effect, a 180° phase shift in the much higher-frequency reference waveform would not substantially change the resulting signal.

The signal at the summing nodes at the output of OTA 46 is integrated by second integrator 47, and the resulting differential voltage is applied to comparators 52+, 52−. This differential voltage corresponds to the integral of a second-order difference signal that is compared with a periodic reference signal. This differential voltage is a periodically varying signal, of both polarities. Comparator 52+ thus generates a pulse-width-modulated output signal at a fundamental frequency set by the reference waveform frequency at line OSC, and that is at a high level during the time that the differential voltage is positive and at a low level during the time that the differential voltage is negative. According to this embodiment of the invention, if the input signal IN+, IN− is significantly higher than the feedback signal FB+, FB−, a large difference current will propagate through PWM modulator 24, and will cause a pulse-width-modulated signal of a duty cycle higher than 50% at the output of comparator 52+ on line PWM+.

Conversely, comparator 52− has its input cross-coupled to the differential voltage at second integrator 47, and as such generates a pulse-width-modulated signal at line PWM− that is complementary relative to the signal at line PWM+ at the output of comparator 52+. In the example where the input signal IN+, IN− is significantly higher than the feedback signal FB+, FB−, the large positive polarity difference current will cause a pulse-width-modulated signal at duty cycle less than 50%, at the output of comparator 52− on line PWM−. And, in class AD fashion, a zero level input signal will, in the steady state, result in complementary PWM signals on lines PWM+, PWM− that are both at a 50% duty cycle.

Figure 6:
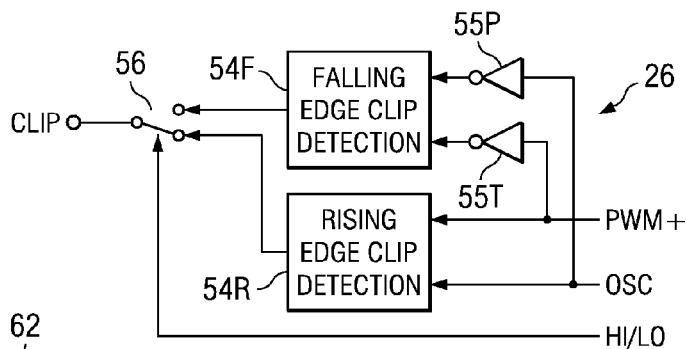
FIG. 6 is an electrical diagram, in block form, of clip detection logic circuitry operating in combination with the modulator circuitry of FIGS. 4 and 5 according to the preferred embodiment of the invention.

Referring now to FIG. 6, the construction of clip detection logic 26 according to the preferred embodiment of the invention will now be described. In this example, clip detection logic 26 receives the output of comparator 52+ on line PWM+, and the periodic signal on line OSC upon which the reference waveform is based. Alternatively, clip detection logic 26 may operate on both pulse-width-modulated outputs (lines PWM+ and PWM−), or simply on the output of comparator 52− on line PWM−, and further in the alternative, clip detection logic 26 may receive the reference waveform itself (e.g., the output of chop circuit 49 of FIG. 5), or another periodic signal corresponding to the reference waveform used in the pulse-width-modulation of PWM modulator 24.

In addition, according to this preferred embodiment of the invention, clip detection logic 26 includes switch 56, which is controlled by a signal on line HI/LO that depends upon the polarity of the voltage applied to load SPKR. It is contemplated that simple logic may be provided to generate the control signal on line HI/LO, for example a simple comparator comparing the levels on lines PWM+, PWM−, or the like.

As shown in FIG. 6, line PWM+ and line OSC are connected to inputs of rising edge clip detection circuit 54R, and are connected to inputs of falling edge clip detection circuit 54F via inverters 55T, 55P, respectively. Alternatively, considering that output line PWM− is complementary to output line PWM+, falling edge clip detection circuit 54F could receive line PWM− at its input, in which case inverter 55T is unnecessary. The outputs of rising and falling edge clip detection circuits 54R, 54F are connected to poles on one side of switch 56, while the opposite side of switch 56 drives output line CLIP. Output line CLIP indicates the presence of a clipping condition when driven at a high logic level by the one of rising and falling edge clip detection circuits 54R, 54F that is selected by the signal on line HI/LO. In this example, line HI/LO selects the output of rising edge clip detection circuit 54R responsive to line PWM+ being high and line PWM− being low, and selects the output of falling edge clip detection circuit 54F responsive to line PWM+ being low and line PWM− being high.

Each of rising and falling edge clip detection circuits 54R, 54F detects the presence of a clip condition by sensing two consecutive edges of the reference signal on line OSC without an intervening edge of the PWM output signal on line PWM+. More specifically, rising edge clip detection circuit 54R detects two cycles (i.e., two successive rising edges) of the reference waveform on line OSC without a rising edge on line PWM+, and falling edge clip detection circuit 54F detects two cycles (i.e., two successive falling edges) of the reference waveform without a falling edge on line PWM+ (i.e., a rising edge on line PWM−). Either of these situations indicates that PWM modulator 24 is clipped, such that the PWM duty cycle on lines PWM+ or PWM−, as the case may be, is 100%.

Alternatively, a single clip detection circuit may be provided for either case (load SPKR driven either high or low). However, the two clip detection circuits 54R, 54F are preferred, in that the response of clip detection logic 26 is at least one-half cycle faster when complementary clip detection circuits are provided.

Figure 7:
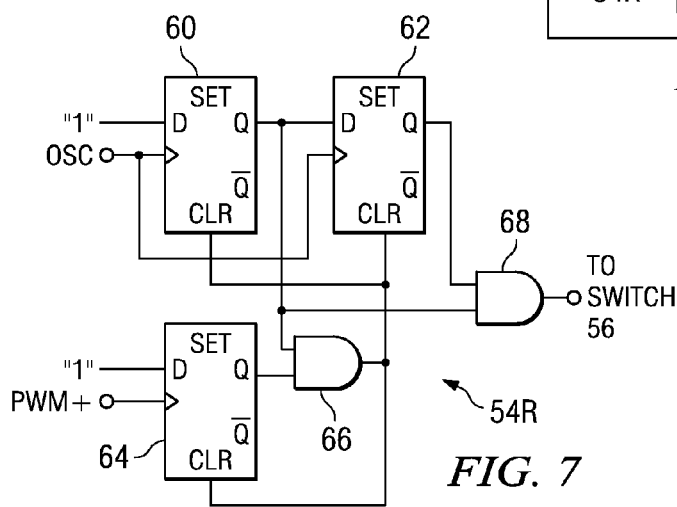
FIG. 7 is an electrical diagram, in schematic form, of a clip detection circuit in the clip detection logic circuitry of FIG. 6 according to the preferred embodiment of the invention.

Referring now to FIG. 7, the construction of rising edge clip detection circuit 54R according to the preferred embodiment of the invention will now be described in detail. Falling edge clip detection circuit 54F will be similarly constructed, in the preferred implementation.

As shown in FIG. 7, D-type flip-flop 60 receives the reference waveform on line OSC at its clock input, and has a high logic level hardwired to its D input. The Q output of flip-flop 60 is connected to the D input of flip-flop 62, which has its clock input also receiving the reference waveform on line OSC. The Q output of flip-flop 62 is connected to one input of AND gate 68, and the Q output of flip-flop 60 is connected to a second input of AND gate 68; the output of AND gate 68 presents the clip detection signal to switch 56 (FIG. 6).

D-type flip-flop 64 receives the pulse-width-modulated output signal from comparator 52+ (or 39A, of FIG. 4) on line PWM+ at its clock input, and also has its D input hardwired to a high logic level. The Q output of flip-flop 64 is connected to one input of AND gate 66; the Q output of flip-flop 60 is connected to a second input of AND gate 66. The output of AND gate 66 is connected to the clear inputs of each of flip-flops 60, 62, 64.

In operation, rising edge clip detection circuit 54R responds to a rising edge of the periodic signal on line OSC by clocking a "1" logic level into its flip-flop 60. The "1" level clocked into flip-flop 60 then appears at the Q output of flip-flop 60, and thus at one input of AND gate 66. When the output of PWM modulator 24 is not clipping, a rising edge will appear on output line PWM+ before the next rising edge on line OSC, because the duty cycle of output line PWM+ is less than 100% when not clipped, and thus must return low and high again within one cycle of the reference waveform. Upon a rising edge being driven on line PWM+, a "1" logic level is clocked into flip-flop 64, and this "1" level appears at the Q output of flip-flop 64 at the second input of AND gate 66. Because both inputs of AND gate 66 are at a "1" level at this point, the output of AND gate 6 makes a low-to-high transition, which resets the state of all of flip-flops 60, 62, 64, resulting in a "0" logic level at the Q outputs of each of flip-flops 60, 62, 64.

The next rising edge of the periodic signal on line OSC will clock the "0" level at the output of flip-flop 60 into flip-flop 62, and will also clock the hardwired "1" level into flip-flop 60. However, the combination of the "0" level at the output of flip-flop 62 with the "1" level at the output of flip-flop 60 cause AND gate 68 to continue to drive its output low. Accordingly, so long as a rising edge on line PWM+ occurs before two successive rising edges on line OSC, which is the case when the output is not clipping, flip-flops 60, 62 are both reset before the "1" level at the Q output of flip-flop 60 is clocked into flip-flop 62. The output of AND gate 68 thus remains low in this non-clipping state.

However, if the output of PWM modulator 24 is clipping, the state of line PWM+ will remain at a high level for several cycles. In the operation of clip detection logic 26 in this event, the first rising edge on line OSC again clocks a "1" level into flip-flop 60, and this "1" level also appears at its Q output. Because no rising edge on line PWM+ appears prior to the next rising edge on line OSC (the output is clipping), flip-flops 60, 62 are not cleared before the next rising edge on line OSC appears. This edge on line OSC clocks the hardwired "1" state into flip-flop 60 itself, but also clocks the previous "1" state at the Q output of flip-flop 60 into flip-flop 62. Upon flip-flop 62 presenting this "1" level at its Q output, both inputs of AND gate 68 become high, and AND gate 68 issues a high level at its output, indicating that clipping has been detected at the output of PWM modulator 24. This signal passes through switch 56 (which is controlled in this case to select the output of rising edge clip detection circuit 54R by virtue of the 100% duty cycle on line PWM+), generating an active level on line CLIP to integrator reset logic 37 (FIGS. 4 and 5).

Upon the detection of a clip condition at the output of PWM modulator 24, and referring back to the example of FIG. 5, the active level on line CLIP is received by integrator reset logic 37. According to this preferred embodiment of the invention, integrator reset logic 37 is combinational logic that drives lines INT1_RST to ground in response to an active level on line CLIP from clip detection logic 26. As a result, any residuals at the summing nodes of first integrator 45 (corresponding to integrator 30 of FIG. 4) are discharged via integrator reset logic 37, and first integrator 45 is removed from the loop filter of PWM modulator 47. This resetting of first integrator 45 thus leaves second integrator 47 as the only integrator in this exemplary, second order, system of PWM modulator 24 of FIG. 5.

Also according to this preferred embodiment of the invention, the second integrator 47 (corresponding to integrator 36 of FIG. 4) continues to operate in PWM modulator 24, so that the loop filter is a first-order filter. However, the operation of second integrator 47 is bounded by saturation level circuit 35, to prevent excursions at these nodes into extreme states that can result from clipping. This clamping of second integrator 47 can be performed responsive to the logic signal on line CLIP issued by clip detection logic 26.

Alternatively, and preferably, this clamping of second integrator 47 can be maintained constantly, both in normal, unclipped, operation and also when clipping is detected. According to the preferred embodiment of the invention, saturation level circuit 35 follows variations in the power supply voltage, for example the voltage on line PSU_FF, so that the clamping voltage generated by saturation level circuit 35 can remain at an optimal level over variations in power supply voltage. It is preferred, according to this embodiment of the invention, that the clamping voltage applied by saturation level circuit 35 about twice the amplitude of the reference waveform (e.g., triangle or sawtooth wave) used in the pulse-width-modulation process. At this level, clamping applied by saturation level circuit 35 does not affect normal, non-clipping, operation yet properly inhibits second integrator 47 from reaching extreme conditions during clipping. Especially if the clamping voltage applied by saturation level circuit 35 follows variations in power supply voltage, the clamping voltage may be applied by saturation level circuit 35 to second integrator 47 at all times, so that additional logic in this regard is not required.

FIG. 8 illustrates an example of the construction of saturation level circuit 35 according to the preferred embodiment of the invention, and for the example in which PWM modulator 24 is a fully differential implementation, as described above relative to FIG. 5. According to this preferred embodiment of the invention, saturation level circuit 35 includes dummy integrator 67, which is constructed of a pair of capacitors of the same size and construction as the capacitors that form second integrator 47 (FIG. 5). Because dummy integrator 67 and second integrator 47 are formed on the same integrated circuit, these capacitors can be closely geometrically matched, and therefore any variations between the capacitance forming second integrator 47 are directly reflected in dummy integrator 67. As known in the art, capacitance variations due to variations in dielectric thickness and photolithography tolerance can be as high as 20%. Dummy integrator 67 in saturation level circuit 35 according to this embodiment of the invention thus accurately matches the clamping voltage also over these manufacturing variations.

Saturation level circuit 35 also includes OTA 68, which receives the power supply voltage on line PSU_FF, and generates a differential current at its output corresponding to the current level of this power supply voltage. Variations in the level of the power supply voltage on line PSU_FF will, of course, directly vary the output differential current from OTA 68. Similarly as in the generating of the reference waveform in PWM modulator 24, in the differential implementation of FIG. 5, this differential current is applied to chop circuit 69, which generates a differential square wave output current of an amplitude corresponding to the output of OTA 68, at a frequency defined by the periodic signal on line OSC. This differential square wave current is applied to dummy integrator 67, which, as in the case of second integrator 47 of FIG. 5, integrates the square wave into a triangle voltage waveform. Accordingly, the combination of OTA 68 and chop circuit 69 with dummy integrator 67 produces a differential voltage that matches the contribution of the reference waveform to the pulse-width-modulation carried out by PWM modulator 24 described above relative to FIG. 5.

In saturation level circuit 35, this differential voltage is sampled by peak sampling circuits 70+, 70−. Peak sampling circuits 70 are constructed in the conventional manner as sample-and-hold circuits with peak detectors, such that the outputs of peak sampling circuits 70+, 70− present the peak amplitude voltage sampled over time. The difference in the voltages output by peak sampling circuits 70+, 70− thus corresponds to the peak-to-peak amplitude of the reference waveform, which of course defines the desired range of the audio output from PWM modulator 24.

The output voltages from peak sampling circuits 70+, 70− are applied to corresponding voltage clamp circuits 72+, 72−. Voltage clamp circuits 72+, 72− are conventional clamp circuits, for example conventional op-amp-based voltage clamp circuits that produce an output voltage limited to a command voltage input, which in this case is the output of the corresponding one of peak sampling circuits 70+, 70−. The outputs of voltage clamp circuits 72+, 72− are applied to corresponding summing nodes at second integrator 47, clamping the voltage of these nodes, despite the duration or amplitude of the signal being applied to, and stored by, second integrator 47. According to the preferred embodiment of the invention, the preferred clamp voltage output by voltage clamp circuits 72+, 72− is twice the amplitude of the output of peak sampling circuits 70+, 70−, respectively. This clamp voltage reflects the voltage, at the inputs to comparators 52+, 52−, just short of clipping, which corresponds to the sum of a DC offset level that results in 100% duty cycle output plus the amplitude of the reference waveform itself.

As mentioned above, saturation level circuit 35 may alternatively be implemented as a conventional clamp circuit that is selectably enabled in response to the clip detection signal on line CLIP. However, especially with the tracking of power supply variations and also the geometric matching of dummy integrator 67, it is preferred that the clamping levels remain at all times, permitting PWM modulator 24 to rapidly respond to the clipping event.

According to the preferred embodiment of the invention, therefore, if PWM modulator 24 is overdriven so that its output is clipped, this clipping condition is detected and the operation of the loop filter is controlled so that extreme voltages are retained within the loop filter. In this exemplary implementation, the loop filter of PWM modulator 24 has its first integrator reset, and its second integrator bounded, so that, during the clipping event, the loop filter behaves as a first order loop with a bounded state. This condition remains so long as the clipping continues. This invention may be applied to PWM modulators of higher than second order, by similarly forcing the system to a bounded, first order, condition during clipping; preferably, this is accomplished by resetting all integrators in such higher-order systems except for the last integrator before the comparators, which preferably has its voltage clamped as described above.

When the audio output is no longer clipping, normal operation of PWM modulator 24 ensues. But because the clip detection circuitry prevented extreme conditions from being driven at the integrating nodes, in this implementation, recovery of PWM modulator 24 rapidly occurs, permitting accurate steady-state operation very soon after the overdriving input is removed. Accordingly, the time duration of distortion caused by clipping at the output is greatly shortened according to the preferred embodiment of the invention.

The preferred embodiment of the invention is described in connection with a class AD audio amplifier driving a bridged load, and more specifically in connection with a fully differential implementation of that amplifier. However, it is contemplated that this invention can be used with benefit in other classes and implementations of class D amplifiers, and that those skilled in the art having reference to this specification can readily adapt this invention in such applications. For example, it is contemplated that this invention can be readily implemented in connection with class BD amplifiers, and also in connection with single-ended loads (i.e., non-bridged loads). In addition, while this preferred embodiment is described in connection with an amplifier involving a second order loop filter, it is also contemplated that the clip detection and improved recovery offered by this invention can be attained in amplifiers using other types of loop filters, and indeed loop filters of order other than two. As mentioned above, for higher order loop filters, it is contemplated that the loop filter is placed into a bounded, first order, condition during clipping, for example by clamping the last integrator in the sequence (i.e., the last integrator prior to the comparator in the PWM modulator) and holding all previous integrators in the loop in reset. Those skilled in the art having reference to this specification will readily appreciate these, and other, alternative implementations of this invention.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of generating pulse-width-modulated signals to be applied to a load, comprising the steps of:
    receiving an analog input signal;
    filtering, with a loop filter comprising at least one integrator, a feedback signal corresponding to an output pulse-width-modulated signal;
    combining the analog input signal with the filtered feedback signal to generate a difference signal;
    generating a first pulse-width-modulated signal responsive to the difference signal and a periodic reference waveform;
    detecting whether the first pulse-width-modulated signal is clipping; and
    responsive to the detecting step detecting clipping, resetting the at least one integrator of the loop filter.

2. The method of claim 1, wherein the detecting step comprises:
    monitoring edges of the first pulse-width-modulated signal;
    monitoring edges of the periodic reference waveform; and
    responsive to receiving successive edges of the periodic reference waveform without a corresponding edge of the first pulse-width-modulated signal, generating a clip detection signal.

3. The method of claim 1, further comprising:
    generating a second pulse-width-modulated signal, complementary to the first pulse-width-modulated signal;
    and wherein the detecting step comprises:
    monitoring edges of the first and second pulse-width-modulated signals;
    monitoring rising and trailing edges of the periodic reference waveform;
    responsive to receiving successive rising edges of the periodic reference waveform without a corresponding edge of the first pulse-width-modulated signal, generating a clip detection signal; and responsive to receiving successive trailing edges of the periodic reference waveform without a corresponding edge of the second pulse-width-modulated signal, generating the clip detection signal.

4. The method of claim 1, wherein the loop filter comprises first and second integrators;
   wherein the resetting step resets the first integrator responsive to the detecting step detecting clipping;
   and further comprising:
      clamping a voltage at the second integrator to a selected voltage.

5. The method of claim 4, wherein the clamping step is performed responsive to the detecting step detecting clipping.

6. The method of claim 4, wherein the clamping step comprises:
   applying a dummy periodic reference waveform to a dummy integrator;
   sampling the voltage at the dummy integrator to determine a peak sampled voltage; and
   generating the selected voltage corresponding to the peak sampled voltage.

7. The method of claim 6, wherein the clamping step further comprises:
   generating the dummy periodic reference waveform having an amplitude corresponding to a current value of a power supply voltage.

* * * * *